(12) United States Patent
Suzuki

(10) Patent No.: US 7,579,911 B2
(45) Date of Patent: Aug. 25, 2009

(54) SEMICONDUCTOR CIRCUIT

(75) Inventor: Yasufumi Suzuki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/081,088

(22) Filed: Apr. 10, 2008

(65) Prior Publication Data
US 2008/0265990 A1 Oct. 30, 2008

(30) Foreign Application Priority Data
Apr. 25, 2007 (JP) ............... 2007-115713

(51) Int. Cl.
*H03F 3/45* (2006.01)
(52) U.S. Cl. ...................... 330/253; 330/261
(58) Field of Classification Search ................. 330/253, 330/69, 257, 261
See application file for complete search history.

(56) References Cited

U.S. PATENT DOCUMENTS

| | | | |
|---|---|---|---|
| 7,049,889 B2* | 5/2006 | Kalb ........................ 330/253 |
| 7,064,609 B1* | 6/2006 | Beck et al. ................. 330/253 |
| 7,209,005 B2* | 4/2007 | Martins ..................... 330/255 |
| 7,301,401 B2* | 11/2007 | Pennock .................... 330/277 |
| 7,411,452 B2* | 8/2008 | Lu et al. .................... 330/253 |
| 7,414,472 B2* | 8/2008 | Ito et al. .................... 330/253 |

FOREIGN PATENT DOCUMENTS

JP  6-237128  8/1994

* cited by examiner

*Primary Examiner*—Henry K Choe
(74) *Attorney, Agent, or Firm*—McGinn IP Law Group, PLLC

(57) ABSTRACT

An amplifier includes differential output and input stages. The differential output stage includes first and second current paths outputting differential signals and connected between first and second power supplies. The first current path includes a first resistance between the first power supply and a first node, first and second transistors between the first node and a second node, and a second resistance between the second node and the second power supply. The second current path includes a third resistance between the first power supply and a third node, third and fourth transistors between the third node and a fourth node, and a fourth resistance between the fourth node and the second power supply. Each gate of the first to fourth transistors is connected to each of the fourth to first nodes, respectively, and output current of the differential input stage is connected to the first and third nodes.

6 Claims, 14 Drawing Sheets

SEMICONDUCTOR CIRCUIT

BACKGROUND OF THE INVENTION

1. Field of the Invention

The present invention relates to a differential amplifier. More specifically, the present invention relates to a differential amplifier stabilizing differential output by controlling output impedance.

2. Description of Related Art

FIG. 9 shows a differential operational amplifier configuring an input stage by NMOS-type differential pair and PMOS-type differential pair and an output stage by cascode current mirror as an amplifier including a typical wide-range common-mode input.

A typical Pch input part 1 and Nch input part 2 with respect to a wide-range common-mode input are configured by input terminals IN+ and IN−, Pch MOS transistors M11, M12, M14, and Nch MOS transistors M9, M10, M13. The MOS transistors M13 and M14 are set to constant current sources by potential of Vb4 and Vb5 that are gate potential.

An output part 3 driving output terminal OUT is configured by cascode-connected Pch MOS transistors M2, M4, and Nch MOS transistors M6, M8.

A current mirror circuit 4 which forms current mirror with the output part 3 is configured by cascode-connected Pch MOS transistors M1, M3, and Nch MOS transistors M5, M7.

The Pch MOS transistors M1 and M2 are set to constant current sources by gate potential Vb1, and gate potential Vb2 is given to the Pch MOS transistors M3 and M4 and gate potential Vb3 is given to the Nch MOS transistors M5 and M6.

Further, in order to give feedback to the gate voltage of each of the Nch MOS transistors M7 and M8 that are current mirror current sources by the current flowing in the Pch input part 1 and Nch input part 2, the gate of each of the MOS transistors M7 and M8 is connected to a node X1. The node X1 is connected to a drain of each of the feedback transistors M3 and M5 of the current mirror circuit 4.

If the current flowing in each of the input parts 1 and 2 is changed by changing the input voltage of each of the inputs IN+ and IN−, current flowing in each of the MOS transistors M3, M5, M7 of the current mirror circuit 4 is changed. If the gate potential of the MOS transistors M7 and M8 is fixed to driving ability having constant current, the MOS transistors M7 and M8 behave in non-saturated region when current of each of the MOS transistors M7 and M8 is reduced. Therefore, VDS potential is reduced, VGS of each of the MOS transistors M5 and M6 increases, and the MOS transistor M5 behaves in non-saturated region. Therefore, VDS potential is reduced and potential of the output OUT is extremely reduced. In the circuit in FIG. 9, gate potential of each of the MOS transistors M7 and M8 is changed and current amount is regulated in order to stabilize output OUT when potential of the node X1 is changed. This means that the MOS transistors M7 and M8 of the current mirror current source serve an important function in order to stabilize amplitude center of output.

Since effect of the power supply noise has recently become larger and larger as the power supply voltage decreases, output needs to be differentiated as in the circuit configuration of the prior art shown in Japanese Unexamined Patent Application Publication No. 6-237128.

FIG. 10 shows a circuit where PNP transistors and NPN transistors shown in Japanese Unexamined Patent Application Publication No. 6-237128 are replaced with Nch MOS transistors and Pch MOS transistors. In this technique, gate voltage of each of the MOS transistors M7 and M8 of the current mirror current source is taken out from central voltage of the cascode-connected transistor of the dummy that is prepared separately from the output current path, thereby realizing stabilized differential output signals OUT+ and OUT−.

However, since the cascode-connected transistor of the dummy that is prepared separately from the output current path is provided, extra current is needed, and high-speed performance and reduced power consumption cannot be realized.

FIGS. 11 and 12 each shows voltage waveform and current waveform of each node of the circuit of prior art in FIG. 10. FIGS. 11 and 12 are added by the present inventor in order to explain a behavior of prior art in FIG. 10. In each of FIGS. 11 and 12, input amplitude potential difference at around power supply voltage of the inputs IN+ and IN− of the circuit of FIG. 10 is indicated in horizontal axis. FIGS. 13 and 14 each shows voltage waveform and current waveform of each node of the circuit of the prior art in FIG. 10. FIGS. 13 and 14 are added by the present inventor in order to explain a behavior of prior art in FIG. 10. In each of FIGS. 13 and 14, input amplitude potential difference at around ground voltage of the inputs IN+ and IN− of the circuit of FIG. 10 is indicated in horizontal axis.

In the circuit of the prior art in FIG. 10, current I21, I22, I23, and I24 need to be flowed in feedback transistors M21, M22, M23, and M24 controlling gate potential of each of the MOS transistors M7 and M8 of the current mirror current source. However, these current have no relationship with I3 and I4, which decide transition speed of output terminals OUT+ and OUT−. A circuit used in a cell phone or the like requires low voltage, low current, and high-speed behavior in order to suppress power consumption. Therefore, it is not desired to flow current having no relationship with the transition speed of the output terminals OUT+ and OUT− as in the circuit of the prior art in FIG. 10.

The potential difference between the output OUT+ and OUT− that are output amplitude is determined by output resistance between the source and the drain of output current I3 and I4 and MOS transistors M15, M16, M4, and M6. The transition speed of the output is determined by gate capacity of the MOS transistor that receives the signals of output OUT+ and OUT− and the output current I3 and I4.

Therefore, since current of each of the output current I3 and I4 reduces, output amplitude and the transition speed are reduced. Since the common-mode input potential of each of the inputs IN+ and IN− is changed from high voltage around power supply voltage to low voltage around ground voltage, the MOS transistors M15, M16, M4, and M6 behave in saturated state. Therefore, the output resistance between the source and the drain is substantially constant and the gate capacity of the MOS transistor receiving the signals of outputs OUT+ and OUT− is constant. However, in the circuit of the prior art, the common-mode input potential of each of the inputs IN+ and IN− is changed from high voltage around power supply voltage to low voltage around ground voltage as described above and the current change of each of the output current I3 and I4 is (I1−I10)/2−I1/2=−I10/2, (I2−I9)/2−I2/2=−I9/2. Therefore, the output amplitude of the circuit output and the transition speed are changed due to the change of the common-mode input potential. Because the current change of each of the output current I3 and I4 changes the amplitude voltage and the transition speed of the outputs OUT+ and OUT−, the operation speed of the circuit receiving the signals of the outputs OUT+ and OUT− is changed. In the typical MOS transistor circuit, the operation speed is decreased when the amplitude voltage of the input signal is small and the transition speed is low. Therefore, current of the output current I3 and I4 changes due to the change of the common-mode input potential and decrease of the operation speed of the circuit receiving the signals of the outputs OUT+ and OUT− is a problem.

SUMMARY

An amplifier including a differential output stage and a differential input stage, in which the differential output stage includes a first current path and a second current path outputting differential signals and connected between a first power supply and a second power supply, the first current path includes a first resistance element between the first power supply and a first node, a first transistor and a second transistor between the first node and a second node, and a second resistance element between the second node and the second power supply, the second current path includes a third resistance element between the first power supply and a third node, a third transistor and a fourth transistor between the third node and a fourth node, and a fourth resistance element between the fourth node and the second power supply, a gate of the first transistor is connected to the fourth node, a gate of the second transistor is connected to the third node, a gate of the third transistor is connected to the second node, a gate of the fourth transistor is connected to the first node, and current output from the differential input stage is connected to the first node and the third node.

According to the amplifier of the present invention, by connecting the gate of the transistor driving the output and a connecting point forming mirror configuration without using the feedback transistor, it is possible to give feedback corresponding to the common-mode input voltage and achieve the differential output without increasing current.

According to the present invention, it is possible to prevent current flowing in the output transistor from being changed due to change of the common-mode input potential and operation speed of the circuit from being reduced.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
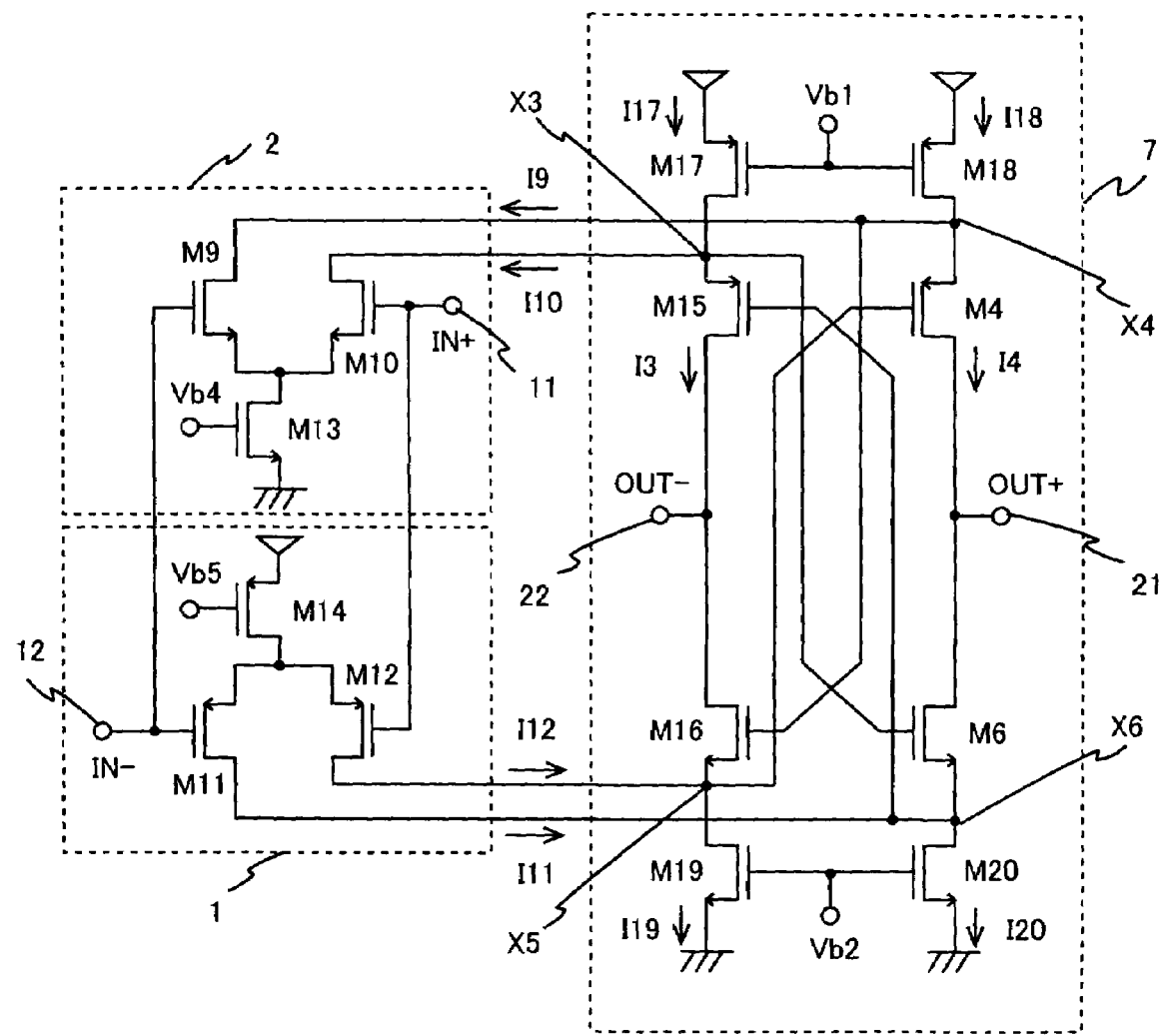
FIG. 1 is an example of a circuit configuration of a semiconductor device according to the present invention.

Hereinafter, the specific embodiment to which the present invention is applied will be described in detail with reference to the drawings. FIG. 1 shows an example of a configuration of a differential output amplifier according to the present embodiment.

A differential output amplifier 100 includes an input terminal 11 (input IN+), an input terminal 12 (input IN−), and a Pch input part 1 and an Nch input part 2 with respect to wide range common-mode input, an output part 7, an output terminal 21 (output OUT+), and an output terminal 22 (output OUT−).

The Pch input part 1 includes Pch MOS transistors M11, M12, and M14. The MOS transistor M11 has a gate connected to the input terminal 12, a drain connected to a node X6, and a source connected to a drain of the MOS transistor M14. The MOS transistor M12 has a gate connected to the input terminal 11, a drain connected to a node X5, and a source connected to a drain of the MOS transistor M14. The MOS transistor M14 has a gate to which potential Vb5 is input, a drain connected to sources of the MOS transistors M11 and M12, and a source connected to high-potential side power supply. The MOS transistor M14 is set to a constant current source by the potential of Vb5 which is gate potential.

The Nch input part 2 includes Nch MOS transistors M9, M10, and M13. The MOS transistor M9 has a gate connected to the input terminal 12, a drain connected to a node X4, and a source connected to a drain of the MOS transistor M13. The MOS transistor M10 has a gate connected to the input terminal 11, a drain connected to a node X3, and a source connected to a drain of the MOS transistor M13. The MOS transistor M13 has a gate to which potential Vb4 is input, a drain connected to sources of the MOS transistors M9 and M10, and a source connected to low-potential side power supply VSS. The MOS transistor M13 is set to a constant current source by the potential of Vb4 which is gate potential.

The output part 7 includes Pch MOS transistors M17, M18, M15, and M4, and Nch MOS transistors M16, M6, M19, and M20. The output part 7 drives the output terminals 21 and 22. The MOS transistor M17 has a gate to which Vb1 is input, a source connected to high-potential side power supply VDD, and a drain connected to the node X3. The MOS transistor M18 has a gate to which Vb1 is input, a source connected to high-potential side power supply VDD, and a drain connected to the node X4. The MOS transistor M15 has a gate connected to the node X6, a source connected to the node X3, and a drain connected to the output terminal 22. The MOS transistor M4 has a gate connected to the node X5, a source connected to the node X4, and a drain connected to the output terminal 21. The MOS transistor M16 has a gate connected to the node X4, a source connected to the node X5, and a drain connected to the output terminal 22. The MOS transistor M6 has a gate connected to the node X3, a source connected to the node X6, and a drain connected to the output terminal 21. The MOS transistor M19 has a gate to which Vb2 is input, a source connected to low-potential side power supply VSS, and a drain connected to the node X5. The MOS transistor M20 has a gate to which Vb2 is input, a source connected to low-potential side power supply VSS, and a drain connected to the node X6. The MOS transistors M17, M15, M16, M19, and M18, M4, M6, M20 are cascode connected.

Current I11 flows in the MOS transistor M11 and current I12 flows in the MOS transistor M12. The MOS transistors M11 and M12 form the Pch input part 1. Current I9 flows in the MOS transistor M9 and current I10 flows in the MOS transistor M10. The MOS transistor M9 and the MOS transistor M10 form the Nch input part 2.

Current I17 flows in the MOS transistor M17, current I18 flows in the MOS transistor M18, current I3 flows in the MOS transistors M15 and M16, current I4 flows in the MOS transistors M4, M6, current I19 flows in the MOS transistor M19, and current I20 flows in the MOS transistor M20. These transistors form the output part 7.

Dimension of each of the transistors is set so that I9 and I10 are equal to each other, I11 and I12 are equal to each other, I17 and I18 are equal to each other, I3 and I4 are equal to each other, and I19 and I20 are equal to each other when the same potential is input to the input IN+ and IN−. In other words, the MOS transistors M9 and M10, the MOS transistors M11 and M12, the MOS transistors M17 and M18, the MOS transistors M15 and M4, the MOS transistors M16 and M6, and the MOS transistors M19 and M20 are each formed in the same dimension.

Although VGS of each of the MOS transistors M17, M18, and M19, M20 is set to be constant by Vb1 and Vb2, current of each of I9, I10, and I11, I12 changes due to the common-mode input potential change of the input IN+ and input IN−. Therefore, I17, I18, I19, and I20 also change, and the MOS transistors M17, M18, and M19, M20 change from saturated state (low current source) to non-saturated state (resistor) depending on the change of current.

In the circuit in FIG. 1, feedback with respect to the common-mode input voltage is given to the gate of each of the output drive transistors M15, M4, M16, and M6 by the cascode-connected transistor of each negative phase output.

Figure 2:
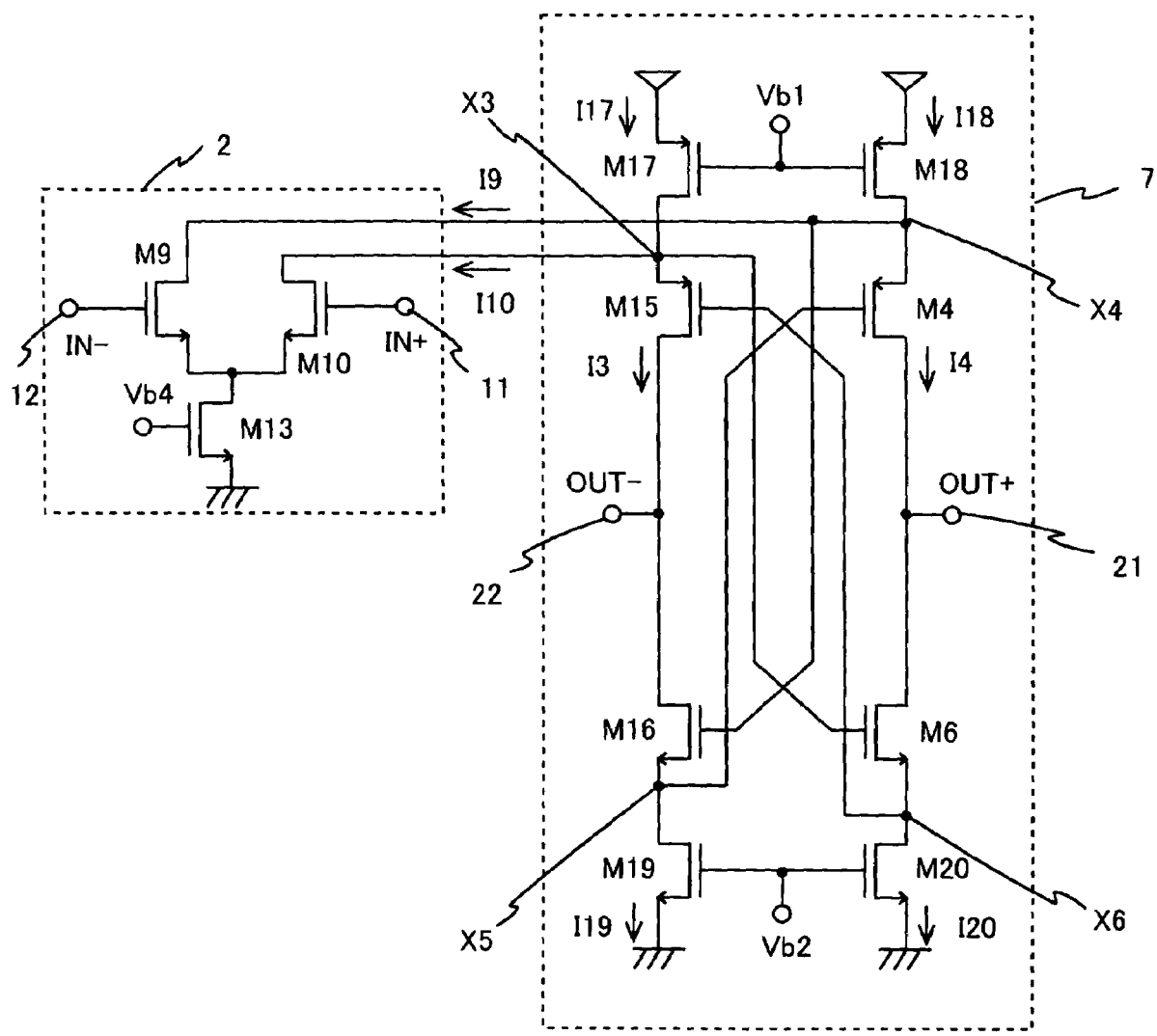
FIG. 2 is another example of the circuit configuration of the semiconductor device according to the present invention.

Hereinafter, the behavior of the differential output amplifier in FIG. 1 will be described. When high voltage where common-mode input potential is around power supply voltage is applied to the input terminals 11 and 12, the Pch input part 1 is turned off and I11 and I12 flowing in the MOS transistors M11 and M12 are 0 A. The Nch input 2 is turned on and current I9 and I10 flow in the MOS transistors M9 and M10. Therefore, when high voltage where common-mode input potential is around power supply voltage is applied, this state is shown in FIG. 2. Hereinafter, description will be made with reference to a circuit configuration shown in FIG. 2.

The Nch input 2 is turned on and potential of each of the nodes X3 and X4 of the output part 7 is reduced. The same current I3 and I4 flow in the MOS transistors M15, M16, and M4, M6. Therefore, potential of each of the nodes X6 and X5 is reduced in order to secure VGS of each transistor.

The MOS transistor M17 is in saturated state (constant current source) and current I17 flows in the MOS transistor M17. Current flowing in the drive transistors M15, M16, and M19 of the output OUT− is current I3 as I17−I10. Similarly, the MOS transistor M18 is in saturated state (constant current source) and current I18 flows in the MOS transistor M18. Current flowing in the drive transistors M4, M6, and M8 of the output OUT+ is current I4 as I18−I9.

Figure 3:
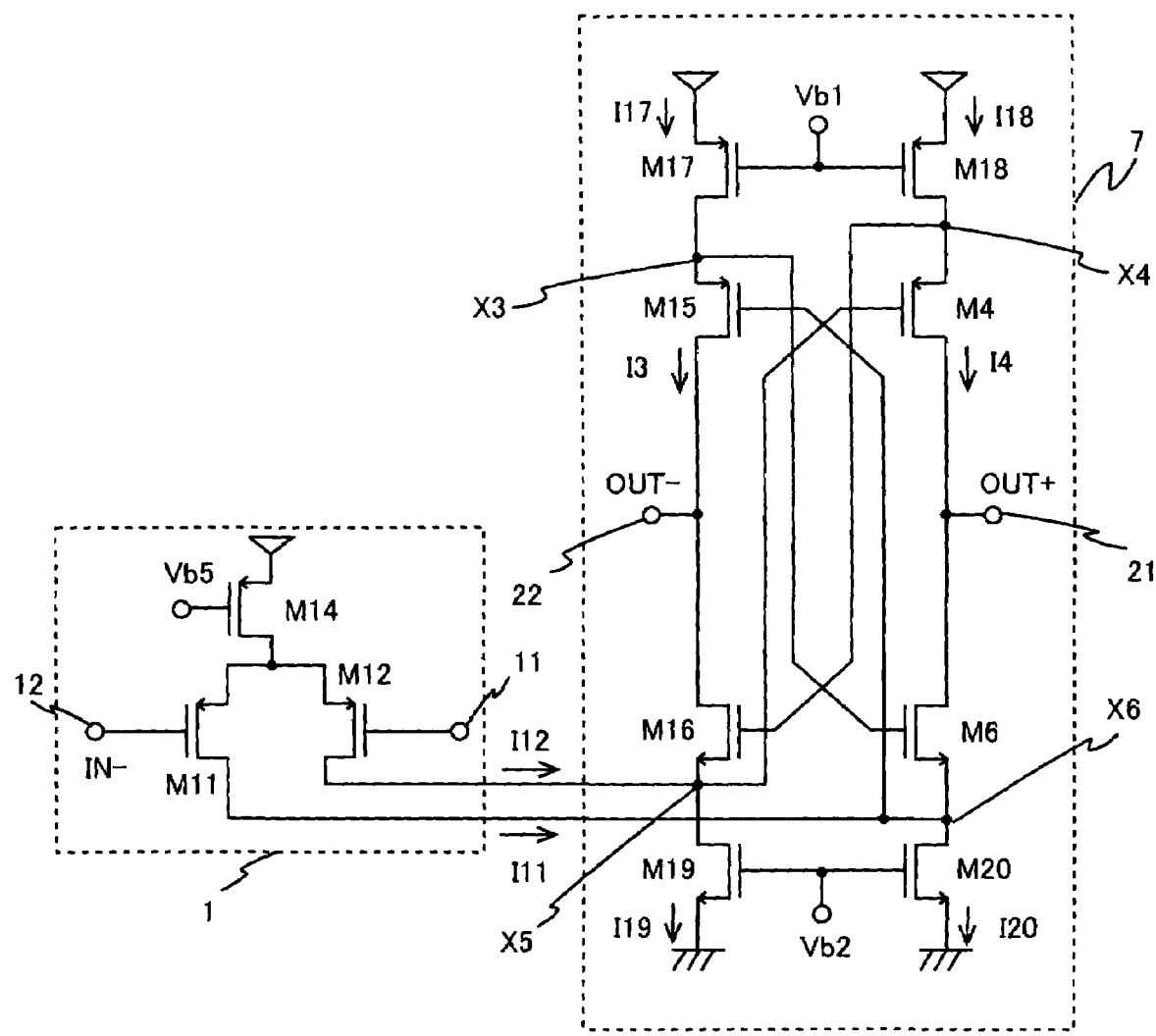
FIG. 3 is another example of the circuit configuration of the semiconductor device according to the present invention.

When low voltage where common-mode input potential is around ground voltage is applied to the input terminals 11 and 12, the Nch input part 2 is turned off and I9 and I10 flowing in the MOS transistors M9 and M10 are 0 A. The Pch input part 1 is turned on and current I11 and I12 flow in the MOS transistors M11 and M12. Therefore, when low voltage where common-mode input potential is around ground voltage is applied, this state is shown in FIG. 3. Hereinafter, description will be made with reference to a circuit configuration shown in FIG. 3.

The Pch input 1 is turned on and potential of each of the nodes X6 and X5 of the output part 7 is increased. The same current I3 and I4 flow in the MOS transistors M15, M16, and M4, M6. Therefore, potential of each of the nodes X3 and X4 is also increased in order to secure VGS of each transistor.

The MOS transistor M19 is in saturated state (constant current source) and current I19 flows in the MOS transistor M19. Current flowing in the drive transistors M15, M16, and M17 of the output OUT− is current I3 as I19−I12. Similarly, the MOS transistor M20 is in saturated state and current I8 flows in the MOS transistor M20. Current flowing in the drive transistors M4, M6, and M18 of the output OUT+ is current I4 as I20−I11.

From above description, it can be understood that the current I3 and I4 due to the difference of the common-mode input potential become equal to each other by making current of each of the MOS transistors M17, M18, M19, and M20 in saturated state and current of each of M13 and M14 in saturated region the same (I3=I17−I10=I19−I12, I4=I18−I9=I20−I11). Since current I3 and I4 are made equal to each other, VGS of each of the M15, M4, M16, and M6 is made equal as well.

Figure 4:
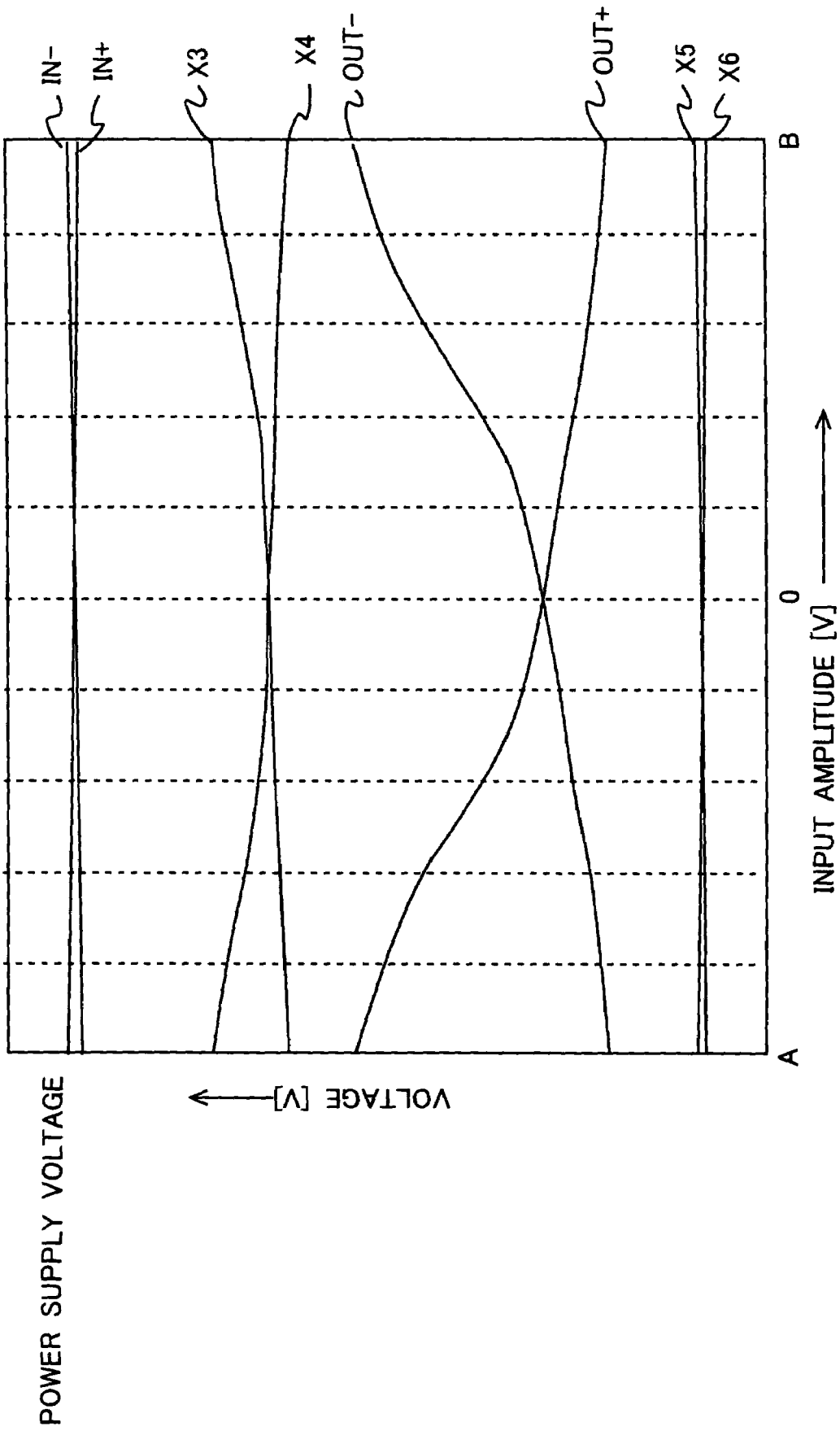
FIG. 4 is an example of an output when voltage around power supply voltage is applied to the input terminal of the circuit of FIG. 1 and a voltage waveform of each node.
Figure 5:
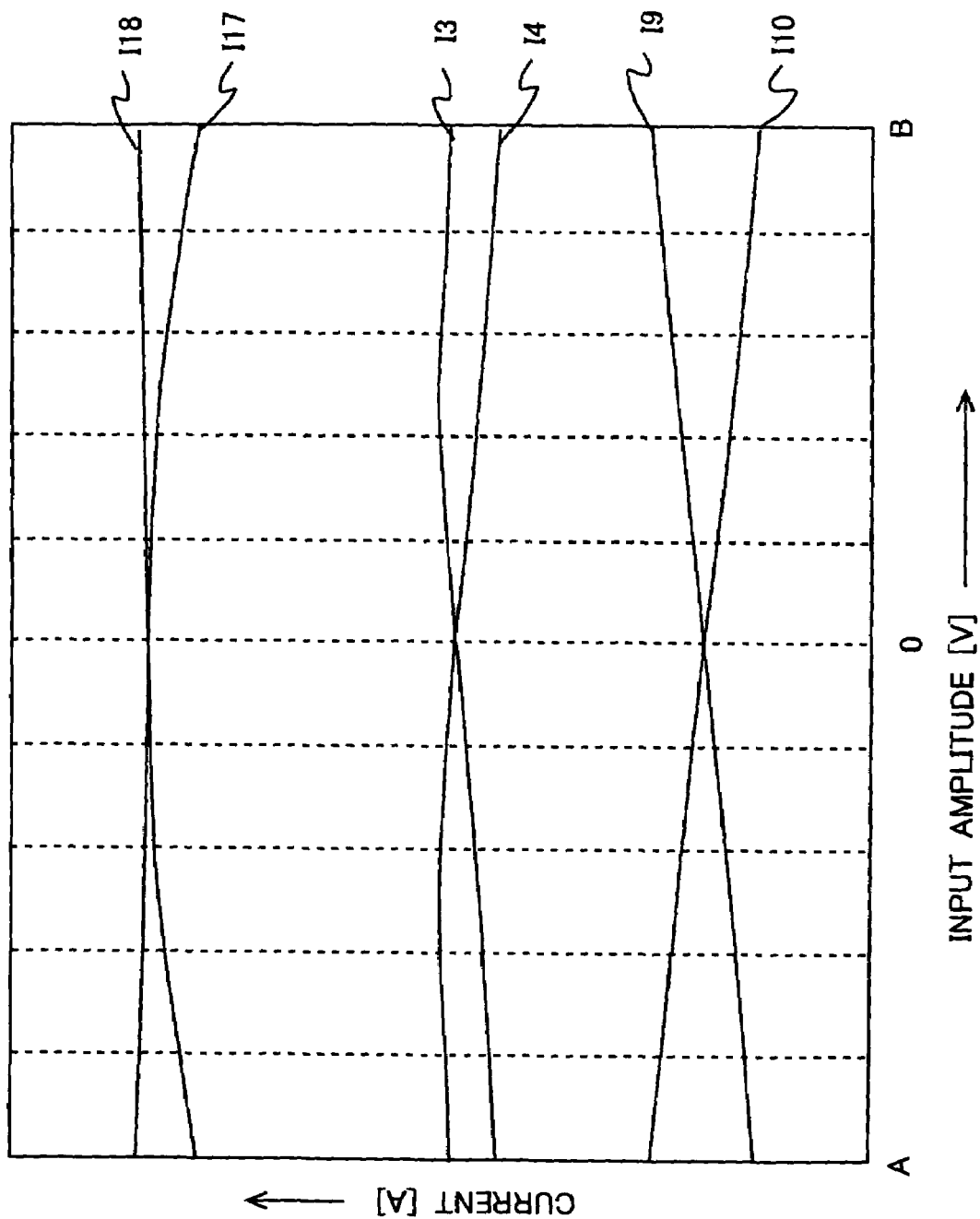
FIG. 5 is an example of an output when voltage around power supply voltage is applied to the input terminal of the circuit of FIG. 1 and a voltage waveform of each node.

FIGS. 4 and 5 each shows a case where signal of differential small-amplitude is input to the input terminals 11 and 12 in high voltage where common-mode input potential is around power supply voltage. In FIG. 4, a horizontal axis indicates potential difference between the input IN+ and the input IN−, and a vertical axis indicates voltage waveform of each node. In FIG. 5, a horizontal axis indicates potential difference between the input IN+ and the input IN−, and a vertical axis indicates current waveform of each transistor. When high voltage where common-mode input potential is around power supply voltage is applied, this state can be shown in FIG. 2.

A points in FIGS. 4 and 5, which means a case where the input IN+ is in power supply voltage and the input IN− is in potential several tens of mV lower than power supply voltage will be described. VGS of each of the MOS transistors M11 and M12 is made equal to or below several tens of mV and therefore completely turned off. Therefore, Pch input part 1 is turned off, and I11 and I12 are 0 mA although not shown in the drawing. VGS of each of the MOS transistors M9 and M10 is sufficiently high potential, current I9 and I10 flow, and potential of each of the nodes X3 and X4 is reduced. Since VDS of each of the MOS transistors M17 and M18 is sufficiently high, the MOS transistors M17 and M18 are constant current sources, and substantially the same current I17 and I18 are flowed.

Since the transistor M10 has higher VGS than the transistor M9 does, current of I10 is larger than current of I9, potential of the node X3 is lower than the potential of the node X4, and current of I4 is larger than current of I3. Since I11 and I12 are 0 mA, current I19 flowing in the MOS transistors M19 and M20 is equal to I3 and I20 is equal to I4. Since current of I20 is larger than current of I19, the MOS transistor M19 is in non-saturated state and VDS is reduced. Therefore, potential of the node X5 becomes lower than potential of the node X6.

From above description, it can be seen that output drive current I4 is larger than I3, potential of the node X4 is higher than that of X3, potential of the node X6 is higher than that of X5, VGS of the MOS transistor M15 is lower than VGS of the MOS transistor M4, and VGS of the MOS transistor M16 is higher than VGS of the MOS transistor M6. Therefore, potential of the output OUT+ is higher than potential of OUT−.

B points in FIGS. 4 and 5, which means a case where potential of the input IN+ is in potential several tens of mV lower than the power supply voltage and potential of IN− is power supply voltage will be described. In this case, mirror circuit is formed with respect to the case where the potential of the IN+ is in power supply voltage and the potential of the IN− is several tens of mV lower than the power supply voltage. Therefore, the outputs OUT− and the OUT+ are inverted.

Figure 6:
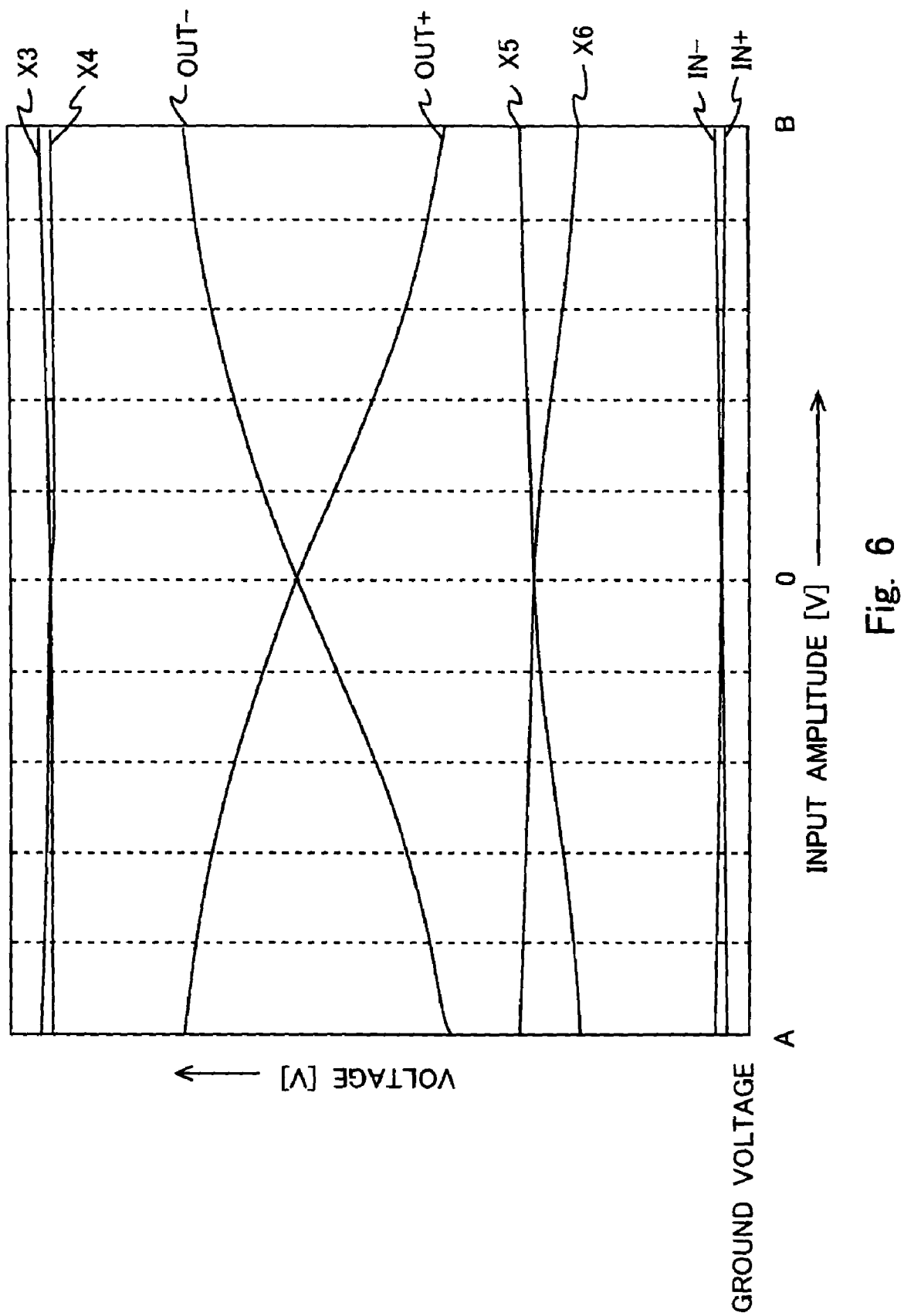
FIG. 6 is an example of an output when voltage around ground voltage is applied to the input terminal of the circuit of FIG. 1 and a voltage waveform of each node.
Figure 7:
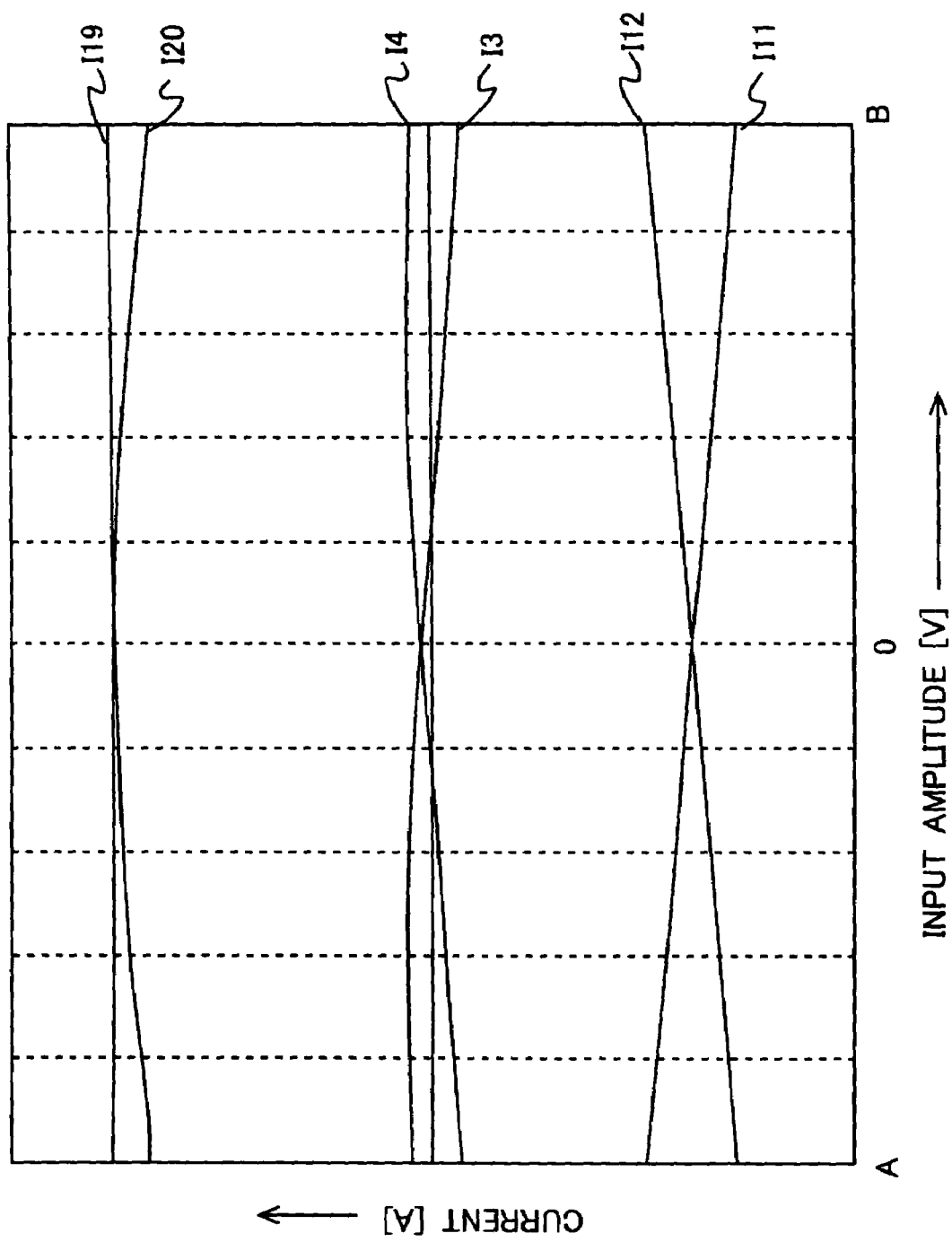
FIG. 7 is an example of an output when voltage around ground voltage is applied to the input terminal of the circuit of FIG. 1 and a voltage waveform of each node.
Figure 13:
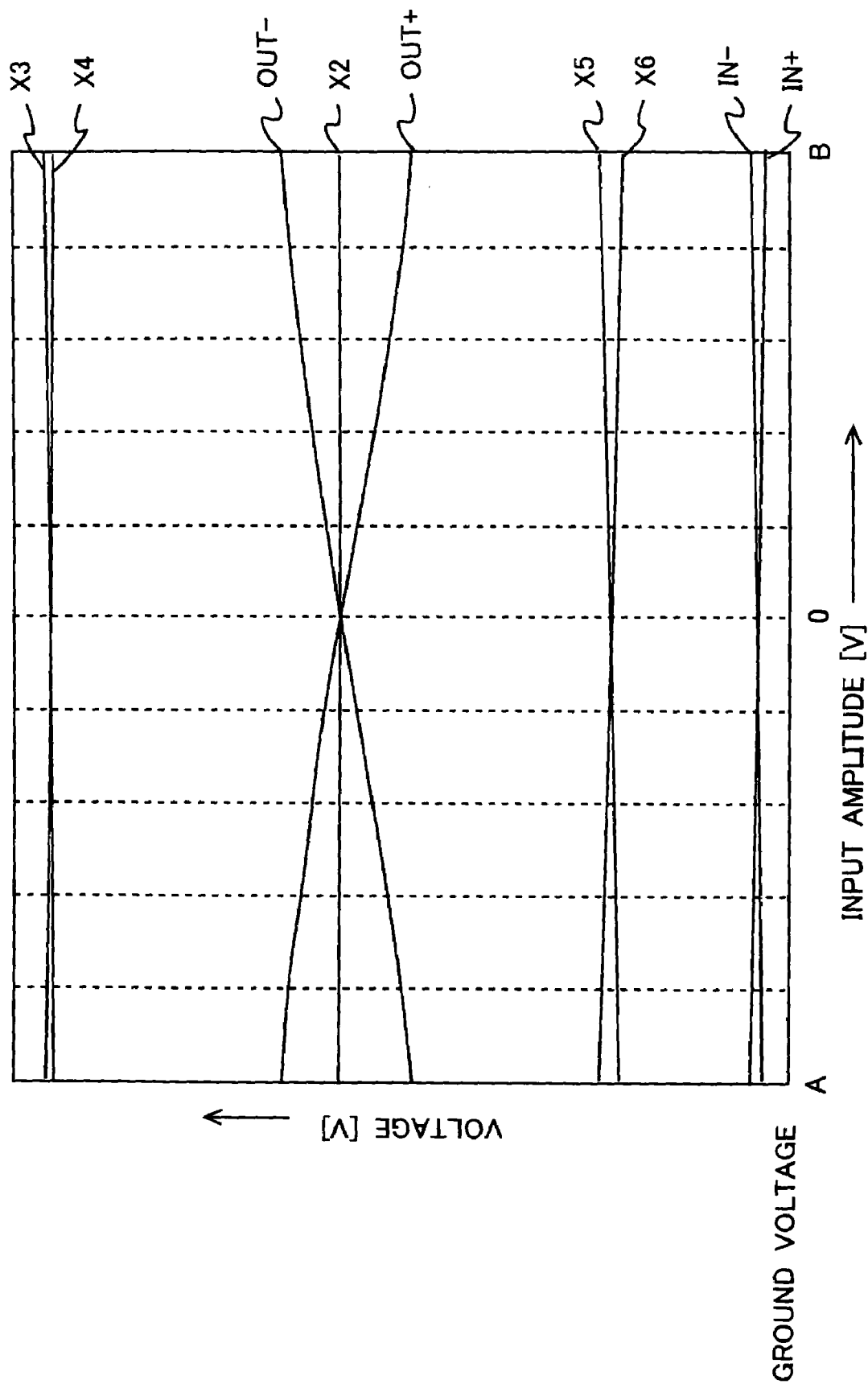
FIG. 13 is an example of an output when voltage around ground voltage is applied to the input terminal of the circuit of FIG. 10 and a voltage waveform of each node.
Figure 14:
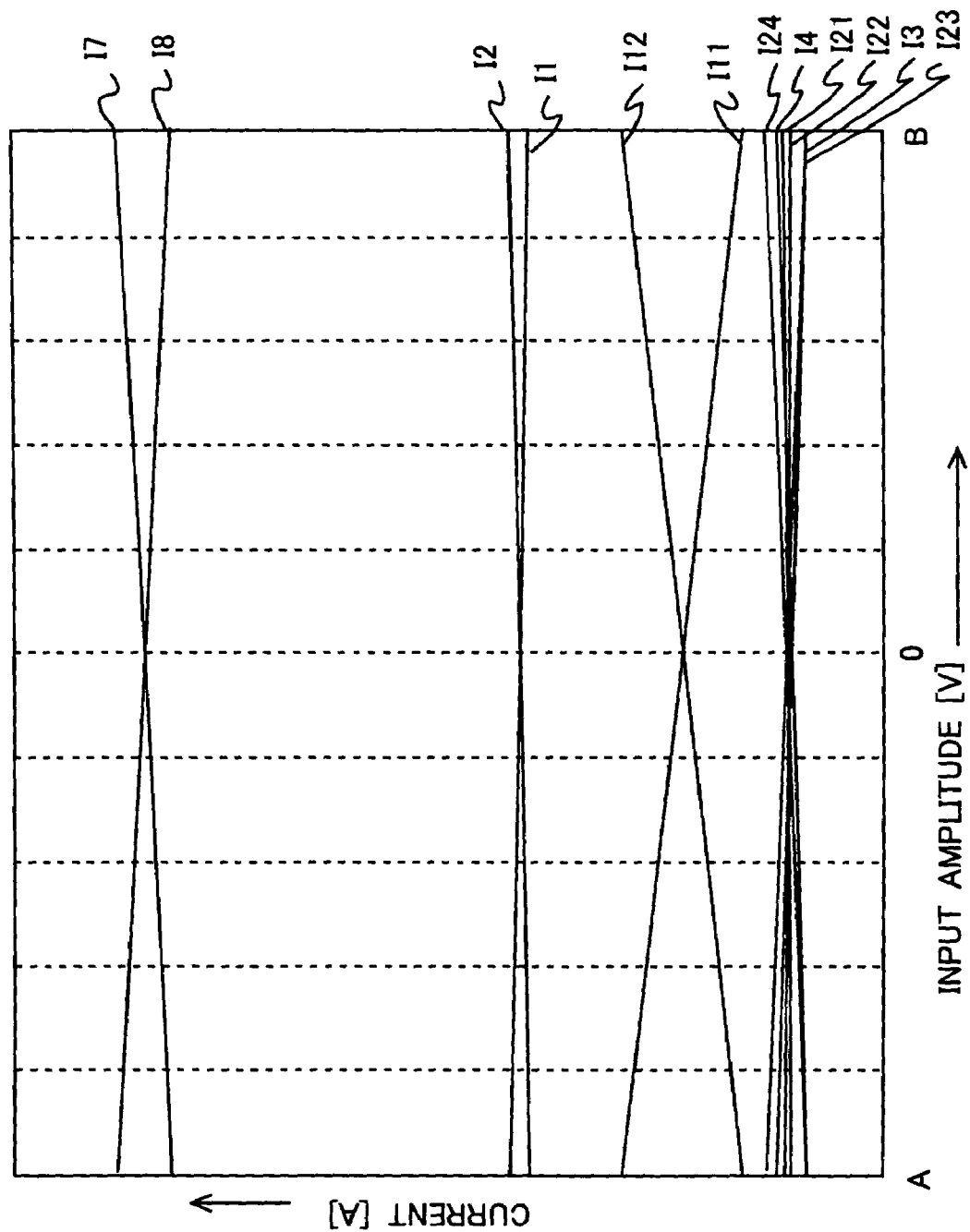
FIG. 14 is an example of an output when voltage around ground voltage is applied to the input terminal of the circuit of FIG. 10 and a voltage waveform of each node.

Now, FIGS. 6 and 7 each shows a case where signal of the differential small-amplitude is input to the input terminals 11 and 12 in low voltage where common-mode input potential is around ground voltage. In FIG. 6, a horizontal axis indicates potential difference between the input IN+ and the input IN− and a vertical axis indicates potential waveform of each node. In FIG. 7, a horizontal axis indicates potential difference between the input IN+ and the input IN− as in FIG. 13 and a vertical axis indicates current waveform of each transistor. As described above, when high voltage where the common-mode input potential is around ground voltage is applied, this state can be shown in FIG. 3.

A points in FIGS. 6 and 7, which means a case where the IN+ is several tens of mV and the IN− is 0.0V will be described. VGS of each of the MOS transistors M9 and M10 is made equal to or below several tens of mV and therefore completely turned off. Therefore, Nch input part 2 is turned off, and I9 and I10 are 0 mA. VGS of each of the MOS transistors M11 and M12 is sufficiently high potential, current I11 and I12 flow, and potential of each of the nodes X5 and X6 is increased. Since VDS of each of the MOS transistors M19 and M20 is sufficiently high, the MOS transistors M19 and M20 are constant current sources, and substantially the same current I19 and I20 are flowed.

Since the MOS transistor M11 has higher VGS than the transistor M12 does, current of I11 is larger than current of I12, potential of the node X6 is higher than the potential of the node X5, and current of I3 is larger than current of I4. Since I9 and I10 are 0 mA, current I17 flowing in the MOS transistors M17 and M18 is equal to I3 and I18 is equal to I4. Since current of I17 is larger than current of I18, the MOS transistor M17 is in non-saturated state and VDS is reduced. Therefore, potential of the node X3 becomes lower than potential of the node X4.

From above description, it can be seen that output drive current I3 is larger than I4, potential of the node X4 is higher than that of X3, potential of the node X6 is higher than that of X5, VGS of the MOS transistor M15 is lower than VGS of the MOS transistor M4, and VGS of the MOS transistor M16 is higher than VGS of the MOS transistor M6. Therefore, potential of the output OUT+ is higher than potential of OUT−.

B points in FIGS. 6 and 7, which means a case where potential of the input IN+ is 0V and potential of the IN− is several tens of mV will be described. In this case, mirror circuit is formed with respect to the case where the potential of the IN+ is in power supply voltage and the potential of the IN− is several tens of mV lower than the power supply voltage. Therefore, the output OUT− and the OUT+ are inverted.

Hereinafter, the effect of the differential output amplifier of the present embodiment in FIG. 1 will be described compared with the circuit of the prior art in FIG. 10.

As described as the problems of the prior art, the circuit operation speed is greatly influenced by the amplitude of each of the outputs OUT+ and OUT− and the transition speed. The amplitude of each of the outputs OUT+ and OUT− and transition speed are greatly influenced by the output currents I3 and I4.

Figure 10:
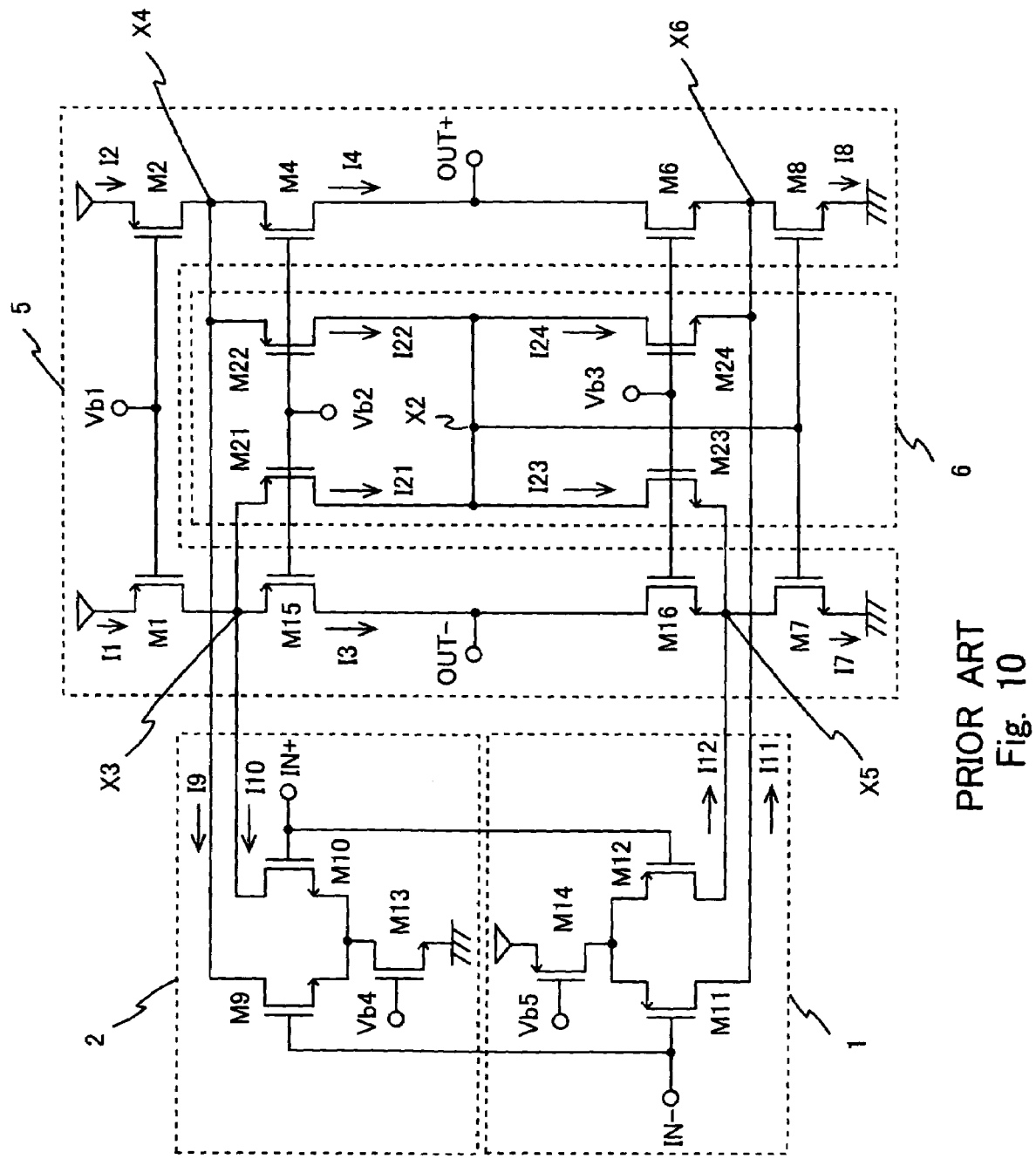
FIG. 10 is an example of the circuit configuration of the semiconductor device according to the related art.
Figure 11:
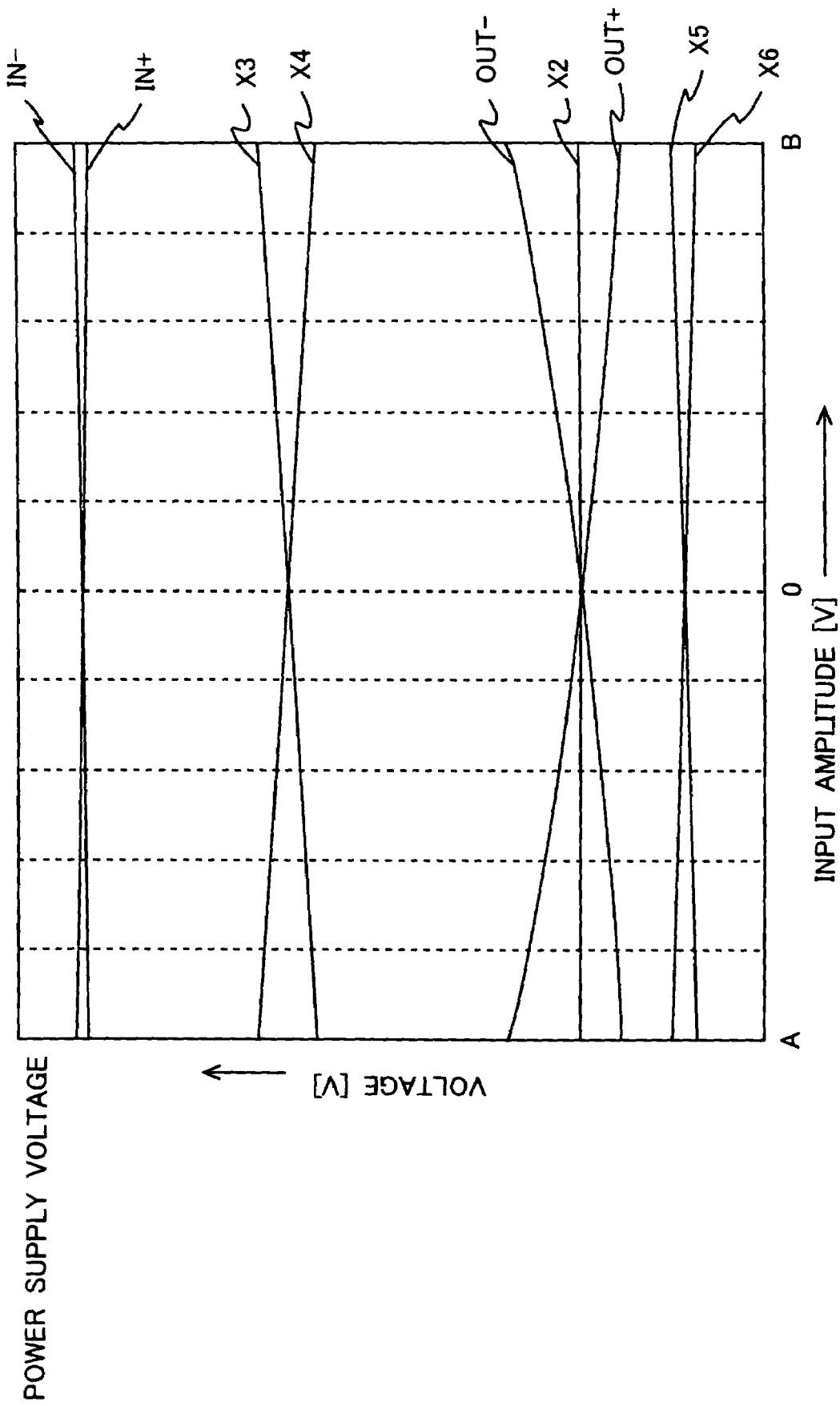
FIG. 11 is an example of an output when voltage around power supply voltage is applied to the input terminal of the circuit of FIG. 10 and a voltage waveform of each node.
Figure 12:
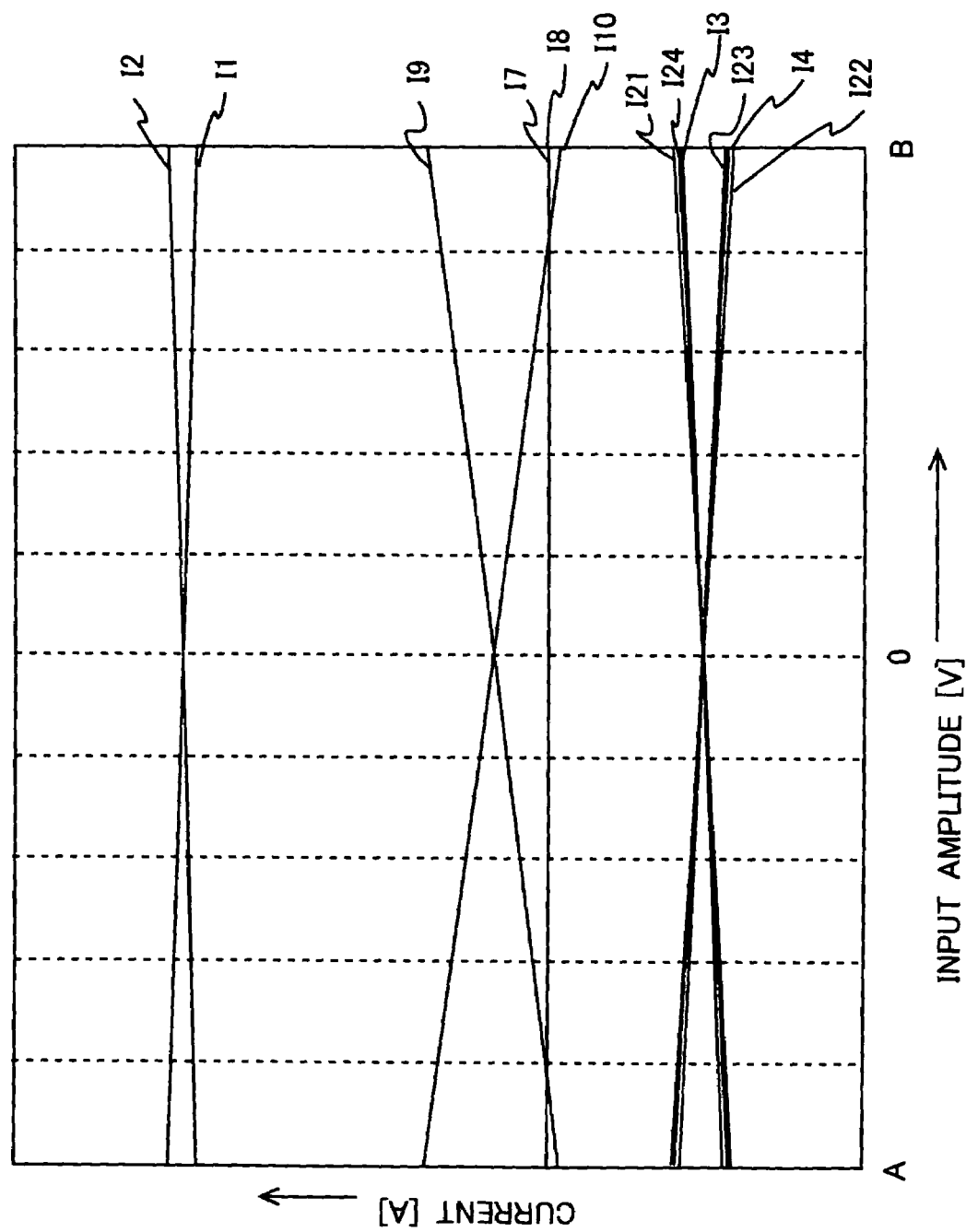
FIG. 12 is an example of an output when voltage around power supply voltage is applied to the input terminal of the circuit of FIG. 10 and a voltage waveform of each node.

According to the circuit of the prior art in FIG. 10, the feedback circuit 6 is provided in addition to the output current I3 and I4 and current of I21+I22 (=I23+I24) needs to be flowed. On the contrary, in the circuit of the present embodiment in FIG. 1, only the output current I3 and I4 need to be flowed. Therefore, power consumption can be reduced.

Further, in the circuit of the present embodiment of FIG. 1, regardless of input common-mode voltage, only an expression I3=I17−I10=I19−I12 needs to be satisfied in order to make the output current I3 constant. Therefore, current I17 of the MOS transistor M17 in saturated state and saturated current I19 of the MOS transistor M19 are made to be equal to each other and the current of the Pch input 1 and the current of the Nch input 2 are made to be equal to each other.

Similarly, only an expression I4=I18−I9=I20−I11 needs to be satisfied in order to make the output current I4 constant. Therefore, current I18 of the MOS transistor M18 in saturated state and saturated current I20 of the MOS transistor M20 are made to be equal to each other and the current of the Pch input 1 and the current of the Nch input 2 are made to be equal to each other. Therefore, fluctuation of the output current I3 and I4 can be made 0 in calculation.

Therefore, by performing feedback to the output drive transistor with respect to input common-mode voltage without adding elements or current paths, current increase can be suppressed and output amplitude and transition speed can be stabilized.

Figure 8:
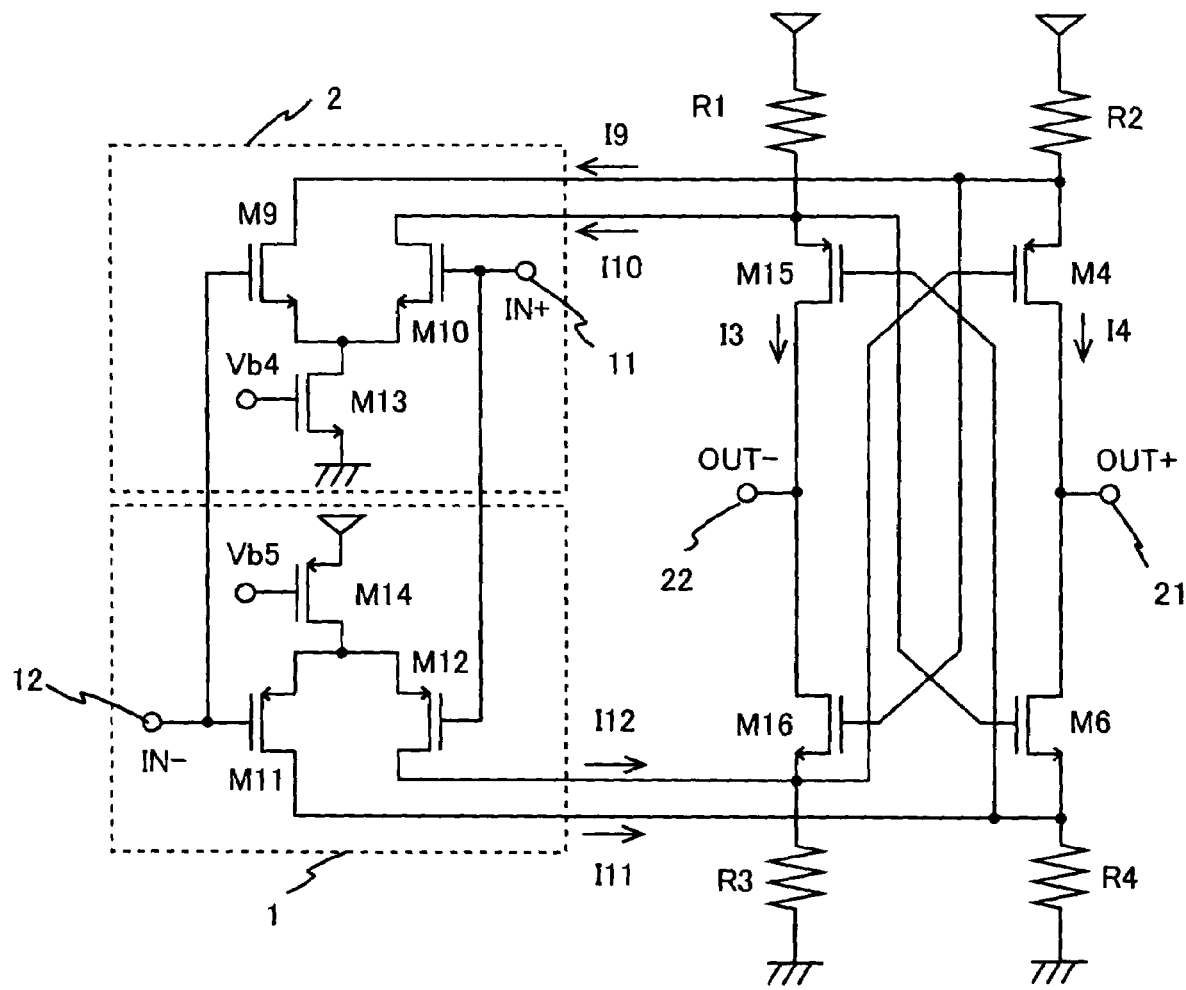
FIG. 8 is an example of a circuit configuration of the semiconductor device according to another embodiment.
Figure 9:
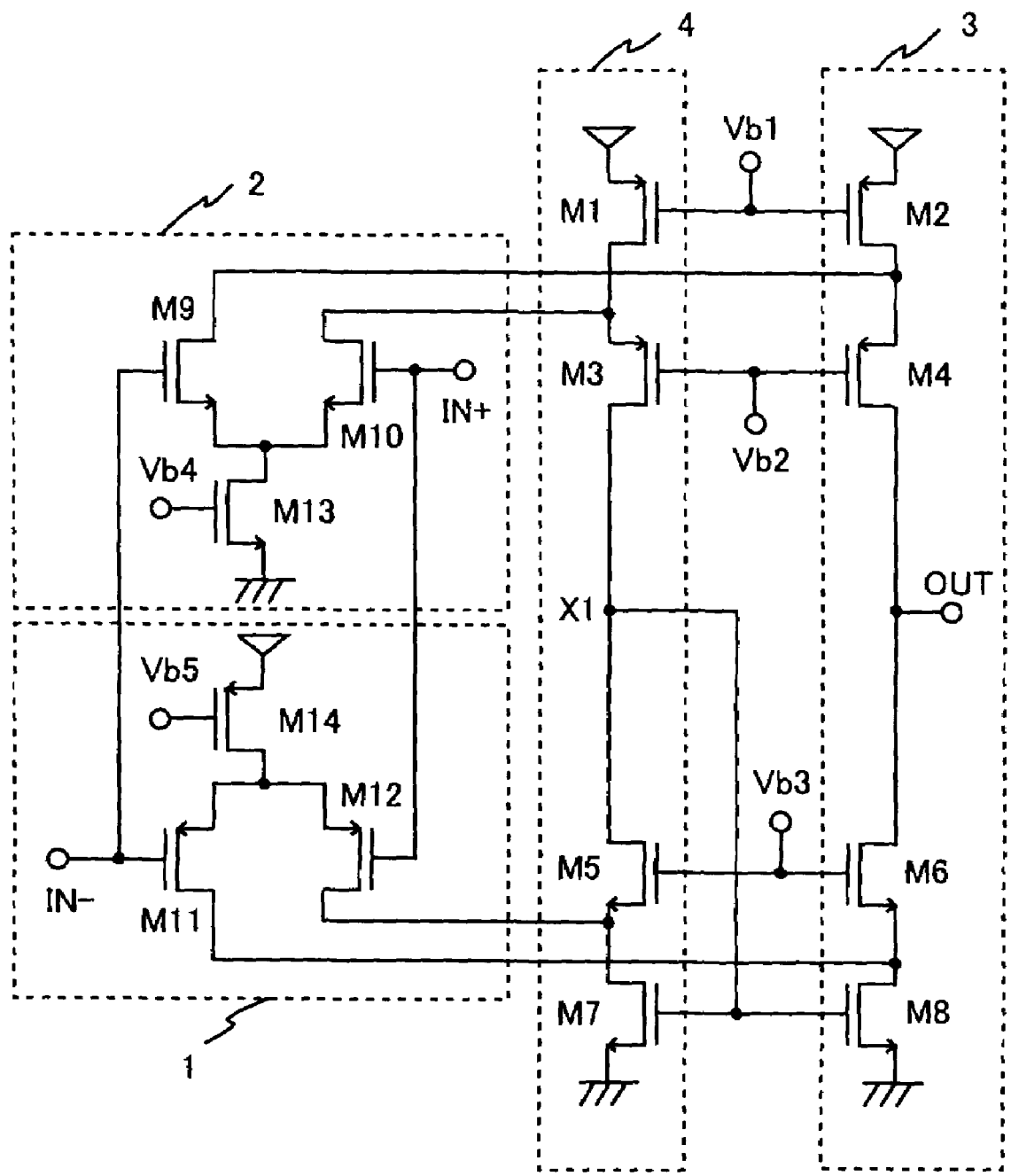
FIG. 9 is an example of a circuit configuration of a semiconductor device according to a related art.

It is apparent that the present invention is not limited to the above embodiments, but may be modified and changed without departing from the scope and spirit of the invention. For example, FIG. 8 shows the circuit configuration of the first embodiment. In the circuit configuration in FIG. 8, the MOS transistors M1, M2, M7, and M8 are changed to resistors R1, R2, R3, and R4. In the circuit of the present embodiment, the same effect can be obtained even in the circuit configuration that is suited for low voltage operation.

What is claimed is:
1. An amplifier including a differential output stage and a differential input stage, wherein
the differential output stage includes a first current path and a second current path outputting differential signals and connected between a first power supply and a second power supply,
the first current path includes a first resistance element between the first power supply and a first node, a first transistor and a second transistor between the first node and a second node, and a second resistance element between the second node and the second power supply, the second current path includes a third resistance element between the first power supply and a third node, a third transistor and a fourth transistor between the third node and a fourth node, and a fourth resistance element between the fourth node and the second power supply, a gate of the first transistor is connected to the fourth node, a gate of the second transistor is connected to the third node, a gate of the third transistor is connected to the second node, a gate of the fourth transistor is connected to the first node, and current output from the differential input stage is connected to the first node and the third node.

2. The amplifier according to claim 1, wherein the first resistance element to the fourth resistance element are formed by transistors.

3. The amplifier according to claim 1, wherein the differential input stage behaves at around first power supply voltage.

4. An amplifier including a differential output stage, a first differential input stage, and a second differential input stage, wherein the differential output stage includes a first current path and a second current path outputting differential signals and connected between a first power supply and a second power supply, the first current path includes a first resistance element between the first power supply and a first node, a first transistor and a second transistor between the first node and a second node, and a second resistance element between the second node and the second power supply, the second current path includes a third resistance element between the first power supply and a third node, a third transistor and a fourth transistor between the third node and a fourth node, and a fourth resistance element between the fourth node and the second power supply, a gate of the first transistor is connected to the fourth node, a gate of the second transistor is connected to the third node, a gate of the third transistor is connected to the second node, a gate of the fourth transistor is connected to the first node, current output from the first differential input stage is connected to the first node and the third node, and current output from the second differential input stage is connected to the second node and the fourth node.

5. The amplifier according to claim 4, wherein the first resistance element to the fourth resistance element are formed by transistors.

6. The amplifier according to claim 4, wherein the first differential input stage is turned off when differential input signal is around first power supply voltage, and the second differential input stage is turned off when differential input signal is around second power supply voltage.

* * * * *